United States Patent
Yamamoto et al.

(10) Patent No.: US 9,017,534 B2
(45) Date of Patent: Apr. 28, 2015

(54) VACUUM DEPOSITION APPARATUS

(75) Inventors: Kenji Yamamoto, Kobe (JP); Satoshi Hirota, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 13/543,330

(22) Filed: Jul. 6, 2012

(65) Prior Publication Data
US 2013/0020195 A1 Jan. 24, 2013

(30) Foreign Application Priority Data

Jul. 22, 2011 (JP) ................. 2011-161264

(51) Int. Cl.
| | |
|---|---|
| *C23C 14/34* | (2006.01) |
| *C23C 14/32* | (2006.01) |
| *C23C 14/35* | (2006.01) |
| *C23C 14/50* | (2006.01) |
| *H01J 37/32* | (2006.01) |
| *H01J 37/34* | (2006.01) |

(52) U.S. Cl.
CPC ......... *C23C 14/3492* (2013.01); *H01J 37/3447* (2013.01); *C23C 14/325* (2013.01); *C23C 14/352* (2013.01); *C23C 14/505* (2013.01); *H01J 37/32055* (2013.01); *H01J 37/3402* (2013.01); *H01J 2237/0264* (2013.01)

(58) Field of Classification Search
CPC ............ H01J 37/3447; H01J 37/32055; H01J 37/3402; H01J 2237/0264; C23C 14/3492; C23C 14/325; C23C 14/352; C23C 14/505
USPC ............. 204/298.11, 298.17, 298.19
See application file for complete search history.

(56) References Cited

U.S. PATENT DOCUMENTS

| | | | |
|---|---|---|---|
| 5,234,561 | A | 8/1993 | Randhawa et al. |
| 7,258,912 | B2 | 8/2007 | Yamamoto et al. |

(Continued)

FOREIGN PATENT DOCUMENTS

| | | |
|---|---|---|
| EP | 2 037 000 A2 | 3/2009 |
| EP | 2 037 000 A3 | 3/2009 |

(Continued)

OTHER PUBLICATIONS

Machine Translation to Tsunoda (JP 2005-048222) published Feb. 2005.*

(Continued)

*Primary Examiner* — John Brayton
(74) *Attorney, Agent, or Firm* — Oblon, McClelland, Maier & Neustadt, L.L.P.

(57) ABSTRACT

Disclosed is a vacuum deposition apparatus which suppresses mutual interference of magnetic fields generated by multiple magnetic-field applying mechanisms for evaporation sources. The vacuum deposition apparatus includes a deposition chamber; a magnetic-field applying mechanism of sputtering evaporation source disposed in the deposition chamber; a magnetic-field applying mechanism of arc evaporation source disposed in the same deposition chamber; and magnetic-field shielding units arranged so as to cover partially or entirely at least one of these magnetic-field applying mechanisms for evaporation sources (preferably the magnetic-field applying mechanism of sputtering evaporation source). Portions (portions to face a target material upon dosing) of openable units of magnetic-field shielding units are preferably made from a non-magnetic material.

4 Claims, 4 Drawing Sheets

(56) References Cited

U.S. PATENT DOCUMENTS

| | | | |
|---|---|---|---|
| 2001/0008707 A1* | 7/2001 | Eerden et al. | 428/615 |
| 2002/0092766 A1 | 7/2002 | Lampkin | |
| 2006/0137968 A1* | 6/2006 | Hartig | 204/192.1 |
| 2007/0278090 A1* | 12/2007 | Yamamoto et al. | 204/192.11 |
| 2009/0078565 A1 | 3/2009 | Rodmar et al. | |
| 2012/0228124 A1 | 9/2012 | Veprek et al. | |

FOREIGN PATENT DOCUMENTS

| | | | |
|---|---|---|---|
| JP | 5-247637 A | | 9/1993 |
| JP | 2004-11018 A | | 1/2004 |
| JP | 2005-48222 | | 2/2005 |
| JP | 2005048222 A | * | 2/2005 |
| JP | 2005-213636 | | 8/2005 |
| JP | 2005-213636 A | | 8/2005 |
| WO | WO 2011/060748 A1 | | 5/2011 |

OTHER PUBLICATIONS

W.-D. Munz et al., "Industrial Scale Manufactured Superlattice Hard PVD Coating", Surface Engineering, 2001, vol. 17, No. 1, pp. 15-27.
A. Schütze et al., "Design and Operation of Modern PVD Coating Machines", Society of Vacuum Coaters 46$^{th}$ Annual Technical Conference Proceedings (2003), 2003, No. 1246, pp. 546-549.
Extended European Search Report issued Nov. 27, 2012 in Patent Application No. 12004988.7.
T. Hurkmans et al.,"A New Large Volume PVD Coating System Using Advanced Controlled Arc and Combined Arc/Unbalanced Magnetron (ABS™) Deposition Techniques", Surface and Coatings Technology, vol. 92, No. 1-2, XP-002522223, Jun. 1, 1997, pp. 62-68.
Korean Office Action issued Sep. 5, 2013, in Korea Patent Application No. 10-2012-79046 (with English translation).

* cited by examiner

VACUUM DEPOSITION APPARATUS

FIELD OF THE INVENTION

The present invention relates to a vacuum deposition apparatus which serves to deposit thin films of various kinds in vacuo.

BACKGROUND OF THE INVENTION

Deposition typically of metallic films are applied to semiconductor components and other articles. As used herein the term "deposition" refers to the formation of a thin film on a base material (substrate) as a work, and exemplary deposition techniques include sputtering and arc vapor deposition.

The sputtering is a technique of evacuating a deposition chamber, then applying a high voltage between the substrate as the work and a target material as a film-forming material while introducing an inert gas such as argon gas into the deposition chamber, allowing the inert gas ionized by glow discharge to collide with the target material to sputter the film-forming material; and depositing the sputtered film-forming material on the substrate to form a thin film.

The arc vapor deposition is a technique of arranging a metal for vapor deposition as a block-shape solid (target material) in a vacuum deposition chamber, and evaporating the target material by arc discharge. The arc migrates on the target material as introduced by a magnetic field applied by the action of a magnetic-field applying mechanism, to evaporate the target material, and the substrate in the deposition chamber is coated with the evaporated target material.

Exemplary deposition techniques using such a vacuum deposition apparatus include sputtering, cathode-discharge arc ion plating, and hollow cathode deposition. These techniques may employ a magnetic-field applying mechanism to apply a magnetic field to an evaporation source, in order to improve deposition rate and ionization rate.

Typically, Japanese Unexamined Patent Application Publication (JP-A) No. 2005-213636 discloses a composite deposition apparatus which includes a deposition chamber, an arc evaporation source having a magnetic-field applying mechanism; and a sputtering evaporation source having a magnetic-field applying mechanism, both of the evaporation sources are arranged in the same deposition chamber.

W. D. Munz et al. describe a deposition apparatus including two or more sputtering evaporation sources each having a magnetic-field applying mechanism in "INDUSTRIAL SCALE MANUFACTURED SUPERLATTICE HARD PVD COATINGS", Surface Engineering 2001 Vol. 17, No. 115; and A. Shutze et al. describe a deposition apparatus including two or more arc evaporation sources each having a magnetic-field applying mechanism in "Design and Operation of Modem PVD Coating Machines," Society of Vacuum Coaters 46th Annual Technical Conference Proceedings (2003) ISSN 0737-5921.

SUMMARY OF THE INVENTION

Two or more magnetic-field applying mechanisms for evaporation sources are provided in the same deposition chamber in order to improve the deposition rate or in order to give a structure typically of a multilayer film by providing target materials having different compositions. However, when two or more magnetic-field applying mechanisms for evaporation sources are provided as being adjacent to one another in the same deposition chamber as in the deposition apparatus disclosed in JP-A No. 2005-213636, the resulting magnetic fields may mutually interfere with one another.

Magnetic-field applying mechanisms for evaporation sources such as those of sputtering evaporation sources and those of arc evaporation sources employ plasma. Ions and electrons constituting the plasma are respectively charged particles, and their behaviors vary as affected by the magnetic fields. Specifically, the mutual interference among magnetic fields generated by the respective magnetic-field applying mechanisms may cause the charged particles to move in a direction deviated from the intended direction. This may impede satisfactory performing of the deposition treatment.

The present invention has been made under these circumstances, and an object of the present invention is to provide a vacuum deposition apparatus which less causes mutual interference between or among magnetic fields generated by two or more magnetic-field applying mechanisms for evaporation sources.

Specifically, the present invention provides a vacuum deposition apparatus which includes a deposition chamber; at least two magnetic-field applying mechanisms arranged in the deposition chamber, the at least two magnetic-field applying mechanisms being selected from the group consisting of a magnetic-field applying mechanism possessed by a sputtering evaporation source and a magnetic-field applying mechanism possessed by an arc evaporation source; and a magnetic-field shielding unit arranged so as to cover partially or entirely at least one of the magnetic-field applying mechanisms. Each of the evaporation sources includes, for example, a target material, a magnetic-field applying mechanism, and a cooling-water system.

In the vacuum deposition apparatus, the magnetic-field shielding unit made from a magnetic material is provided so as to cover partially or entirely at least one of the two or more magnetic-field applying mechanisms, i.e., at least one of the magnetic-field applying mechanism of the sputtering evaporation source and the magnetic-field applying mechanism of the arc evaporation source. The magnetic-field shielding unit can shield a magnetic field generated by the covered magnetic-field applying mechanism. This suppresses the mutual interference of magnetic fields generated by the respective magnetic-field applying mechanisms, thereby protects the behaviors of ions and electrons constituting the plasma from varying by the action of magnetic fields, and reduces the possibility of adverse effects on the deposition treatment.

When the magnetic-field shielding unit is disposed openably (i.e., openably and closably), the magnetic-field shielding unit can be opened upon deposition; whereas the magnetic-field shielding unit is closed when deposition is not performed so as to suppress the mutual interference of magnetic fields.

Part of the magnetic-field shielding unit is preferably made from a non-magnetic material. In some evaporation sources, magnetic lines of force extend in a direction toward the substrate to introduce the plasma in the direction of the substrate; and this improves the deposition rate or enhances application of ions to the substrate. When the magnetic-field shielding unit is entirely made from a magnetic material, the magnetic-field shielding unit may affect magnetic lines of force even when the magnetic-field shielding unit is opened.

To avoid this, part of the magnetic-field shielding unit is made from a non-magnetic material in a preferred embodiment. In this embodiment, the magnetic-field shielding unit, when closed, acts to shield the magnetic field satisfactorily, whereas the magnetic-field shielding unit, when opened, exhibits low magnetic-field shielding effects.

The non-magnetic material may be arranged at such a position of the magnetic-field shielding unit as to face an evaporation source when the magnetic-field shielding unit is dosed.

In a preferred embodiment, the magnetic-field applying mechanism of sputtering evaporation source is an unbalanced magnetron (UBM) mechanism; the vacuum deposition apparatus has at least one magnetic-field applying mechanism of sputtering evaporation source and at least one magnetic-field applying mechanism of arc evaporation source; and the magnetic-field shielding unit is arranged so as to face the at least one magnetic-field applying mechanism of sputtering evaporation source. The magnetic-field shielding unit, when arranged so as to face the at least one magnetic-field applying mechanism of sputtering evaporation source which generates a strong magnetic field, helps to further suppress the mutual interference of magnetic fields.

According to the present invention, the magnetic-field shielding unit is provided so as to cover partially or entirely at least one of the magnetic-field applying mechanism of the sputtering evaporation source and the magnetic-field applying mechanism of the arc evaporation source. The magnetic-field shielding unit can thereby shield a magnetic field generated by the covered magnetic-field applying mechanism. The vacuum deposition apparatus can thereby advantageously suppress the mutual interference of magnetic fields.

DESCRIPTION OF THE PREFERRED EMBODIMENTS

A vacuum deposition apparatus according to an embodiment of the present invention will be illustrated with reference to the attached drawings.

Figure 1:
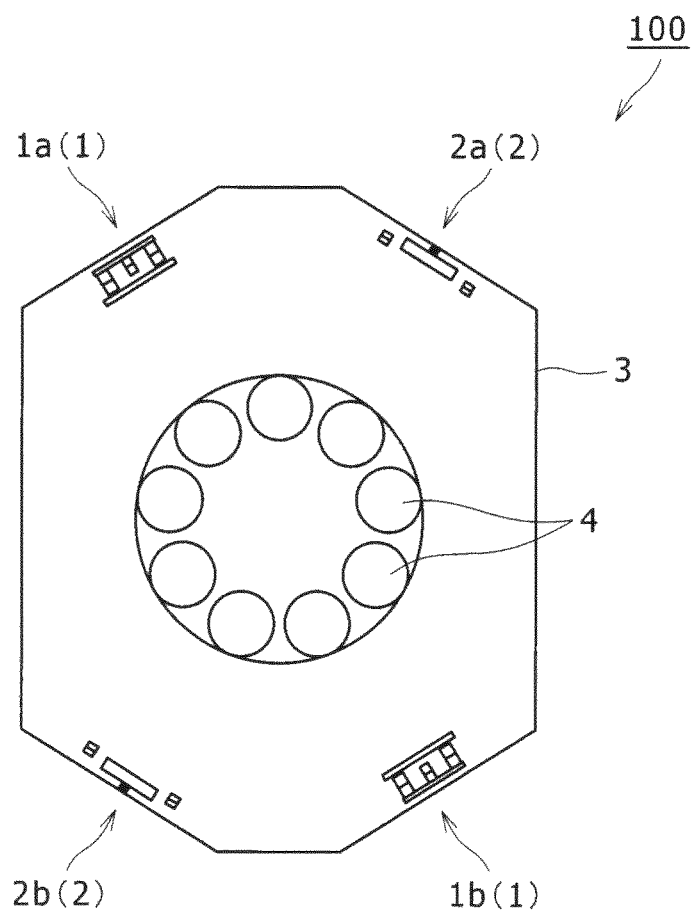
FIG. 1 is a plan view illustrating the structure of a vacuum deposition apparatus according to an embodiment of the present invention.

FIG. 1 is a plan view illustrating the structure of a vacuum deposition apparatus 100 according to the embodiment.

With reference to FIG. 1, the vacuum deposition apparatus 100 mainly includes a deposition chamber 3, and magnetic-field applying mechanisms 1 (1a and 1b) of sputtering evaporation source and multiple magnetic-field applying mechanisms 2 (2a and 2b) of arc evaporation source. These magnetic-field applying mechanisms are arranged so as to surround substrates 4 which are arranged as works at the center part in the deposition chamber 3.

The magnetic-field applying mechanisms 1 of sputtering evaporation sources may be unbalanced magnetron (UBM) magnetic-field applying mechanisms.

Such UBM magnetic-field applying mechanisms 1 of sputtering evaporation sources have magnets having different sizes in different numbers as arranged in the central part and in the periphery thereof. For example, a small neodymium magnet is arranged in the central part, and large neodymium magnets are arranged in the periphery. When magnets are arranged in such an unbalanced manner, the magnetic lines of force do not constitute a dosed magnetic field, and part of magnetic lines of force generated by the action of more strong magnets in the periphery extend to the vicinity of the substrate. This allows plasma (e.g., argon (Ar) plasma) generated along the magnetic lines of force upon sputtering to diffuse to the vicinity of the substrate. The UBM magnetic-field applying mechanisms 1 of sputtering evaporation sources therefore allow larger amounts of Ar ions and electrons to move along the magnetic lines of force and to reach the substrate, because the magnetic lines of force extend to and reach the vicinity of the substrate.

The magnetic-field applying mechanism 1a of sputtering evaporation source and the magnetic-field applying mechanism 1b of sputtering evaporation source are symmetrically arranged with respect to the substrates 4; and the magnetic-field applying mechanism 2a of arc evaporation source and the magnetic-field applying mechanism 2b of arc evaporation source are symmetrically arranged with respect to the substrates 4.

Upon deposition, a film-forming gas is fed into the deposition chamber 3. Examples of the film-forming gas include gases each containing a nitrogen source (e.g., nitrogen); gases each containing both a carbon source (e.g., methane) and a nitrogen source; and gases derived from these gases except for diluting them. As being rotated, the substrates 4 mutually pass through the front of the magnetic-field applying mechanisms 1a and 1b of sputtering evaporation source and through the front of the multiple magnetic-field applying mechanisms 2a and 2b of arc evaporation source. Thus, multiple pairs of a first layer and a second layer can be deposited on the substrates 4 alternatively, and this gives a multilayer thin film. The thicknesses of the respective layers can be controlled by the rotational speed of the substrates 4 or by the power (evaporation rate) to be applied to the target materials.

Figure 2:
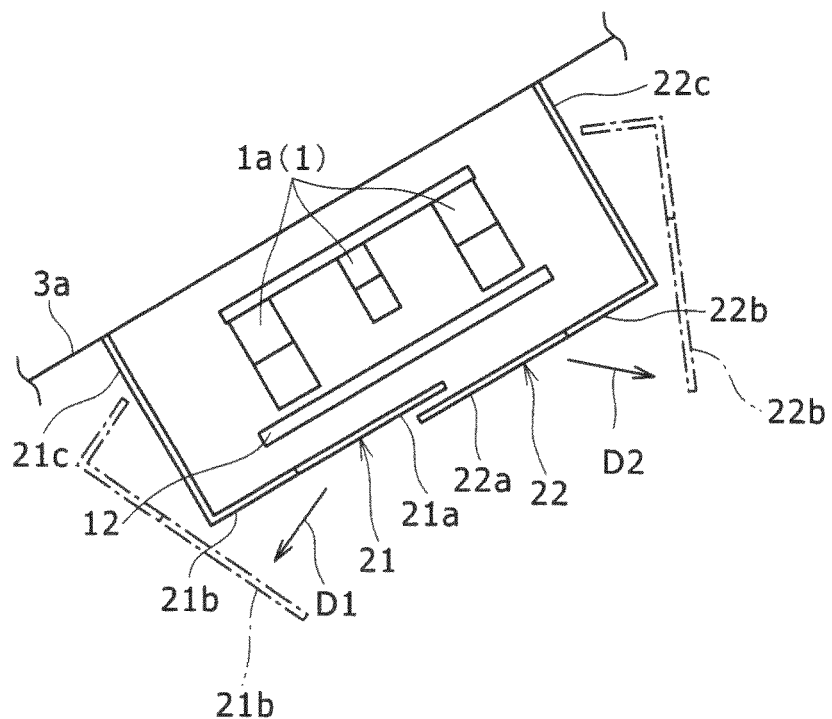
FIG. 2 is a plan view illustrating a magnetic-field shielding unit which shields a magnetic field generated by a magnetic-field applying mechanism of sputtering evaporation source.
Figure 3:
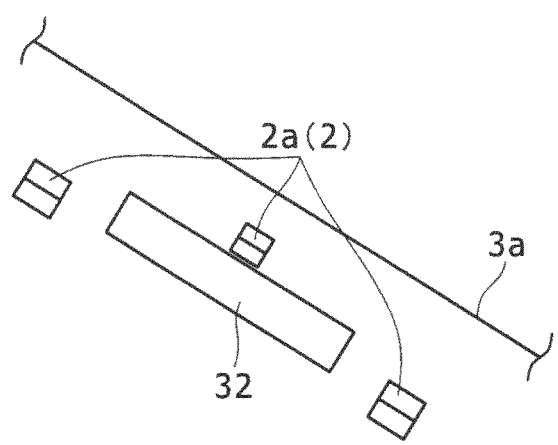
FIG. 3 is a plan view illustrating the structure of a magnetic-field applying mechanism of arc evaporation source.

FIG. 2 is a plan view illustrating magnetic-field shielding units 21 and 22 which shield magnetic fields generated by the magnetic-field applying mechanism 1a of sputtering evaporation source. FIG. 3 is a plan view illustrating the structure of the magnetic-field applying mechanism 2a of arc evaporation source. In an embodiment (structure) illustrated in FIG. 2, the magnetic-field shielding units 21 and 22 are both provided with respect to one of the two magnetic-field applying mechanisms 1a and 1b of sputtering evaporation sources, i.e., with respect to the magnetic-field applying mechanism 1a of sputtering evaporation source. However, magnetic-field shielding unit(s) may also be arranged with respect to the other magnetic-field applying mechanism 1b of sputtering evaporation source in the same manner.

With reference to FIG. 2, the magnetic-field applying mechanism 1a of sputtering evaporation source is arranged on the back side of a target material 12 (near to an inner wall 3a of the deposition chamber). The magnetic-field applying mechanism 1a of sputtering evaporation source performs deposition on a substrate 4 in the front side of the target material 12. The magnetic-field applying mechanism 1b of sputtering evaporation source has the same configuration as the magnetic-field applying mechanism 1a of sputtering evaporation source.

L-shaped magnetic-field shielding units 21 and 22 are provided so as to cover the magnetic-field applying mechanism 1a of sputtering evaporation source.

The magnetic-field shielding units 21 and 22 include openable units 21b and 22b, and fixed units 21c and 22c, respectively. The openable units 21b and 22b are arranged so as to be opened and closed. The fixed units 21c and 22c are respectively fixed to one side of the magnetic-field applying mechanism 1a of sputtering evaporation source. The openable units 21b and 22b, when closed, are connected to the fixed units 21c and 22c, respectively.

Each one end of the fixed units 21c and 22c are fixed to the deposition chamber inner wall 3a The magnetic-field shielding units 21 and 22 have switching mechanisms (not shown) so as to close and open the openable units 21b and 22b, respectively.

When deposition is performed by the magnetic-field applying mechanism 2 of arc evaporation source, the openable units 21b and 22b of the magnetic-field shielding units 21 and 22 are closed so as to suppress the mutual interference of magnetic fields. Thus, a magnetic field generated by the magnetic-field applying mechanism 1a of sputtering evaporation source is shielded by the magnetic-field shielding units 21 and 22, and this suppresses the mutual interference with the magnetic field generated by the magnetic-field applying mechanism 2 of arc evaporation source.

The magnetic-field shielding units 21 and 22 are each mainly made from a magnetic material, but portions of the openable units 21b and 22b (portions to face to the target material 12 when dosed) are made from non-magnetic materials 21a and 22a This configuration is employed based on the following reasons.

In some evaporation sources, magnetic lines of force extend to the substrate, this introduces plasma in the direction of the substrate to improve the deposition rate or to enhance the application of ions to the substrate. The magnetic-field shielding units 21 and 22, if entirely composed of a magnetic material, may affect the magnetic lines of force even when the magnetic-field shielding units 21 and 22 are opened.

Accordingly, portions of the openable units 21b and 22b (portions to face to the target material 12 when dosed) are made from the non-magnetic materials 21a and 22a. This enables shielding of magnetic field when the openable units 21b and 22b are closed, and reduces the magnetic-field shielding effects when the openable units 21b and 22b are opened. Specifically, this allows the shape and strength of magnetic lines of force upon opening of the openable units 21b and 22b to be similar to those in the case where the magnetic-field shielding units 21 and 22 are not provided.

When the openable units 21b and 22b are opened respectively in directions indicated by the arrows D1 and D2 (indicated by dot-and-dash lines in FIG. 2), the magnetic field generated by the magnetic-field applying mechanism 1a of sputtering evaporation source is not shielded by the magnetic-field shielding units 21 and 22. Upon deposition, the openable units 21b and 22b are opened as above. When the openable units 21b and 22b are closed, the openable units 21b and 22b overlap each other at their edges.

With reference to FIG. 3, the magnetic-field applying mechanisms 2a of arc evaporation source are arranged on the lateral sides and on the back side (near to the deposition chamber inner wall 3a) of the target material 32. The magnetic-field applying mechanisms 2b of arc evaporation sources have the same configuration as with the magnetic-field applying mechanisms 2a of arc evaporation sources.

The magnetic-field shielding units 21 and 22 are each basically made from a sheet of magnetic material. The magnetic-field shielding effect varies depending on relative magnetic permeability. A magnetic-field shielding unit having a relative magnetic permeability of about 300 or more may shield a magnetic field effectively. For further higher magnetic-field shielding effects, the magnetic-field shielding units herein are preferably made from a material having a relative magnetic permeability of 500 or more.

Exemplary materials having a relative magnetic permeability of 300 or more include SUS430 stainless steel, whereas exemplary materials having a relative magnetic permeability of 500 or more include SS400 steel.

According to the embodiment, the magnetic-field shielding units 21 and 22 shield the magnetic field generated by the magnetic-field applying mechanism 1 of sputtering evaporation source, and this suppresses the mutual interference between magnetic field generated by the magnetic-field applying mechanism 1 of sputtering evaporation source and the magnetic field generated by the magnetic-field applying mechanism 2 of arc evaporation source. This in turn suppresses the behaviors of ions and electrons constituting the plasma from varying by the action of magnetic fields and reduces the possibility of adverse effects on the deposition treatment.

Other Embodiments

In the aforementioned embodiment, the magnetic-field shielding units 21 and 22 are provided independently. In another possible embodiment, the magnetic-field shielding units 21 and 22 may be designed to also serve as a shuttering mechanism for an evaporation source.

In the aforementioned embodiment, the magnetic-field shielding units 21 and 22 are provided for the magnetic-field applying mechanism 1a of sputtering evaporation source. The configuration, however, is not limited thereto, and magnetic-field shielding units 21 and 22 may also be provided for the magnetic-field applying mechanism 2 of arc evaporation source.

The magnetic-field shielding units 21 and 22 in the embodiment are designed to be L-shaped, but their shapes are not limited thereto. Exemplary modification embodiments are an embodiment in which a door is provided in a partition, and the door is designed to be openable and closable; and an embodiment in which a window is provided in a partition, and the window is designed to be slid so as to open and close the magnetic-field shielding unit.

In the embodiment, the magnetic-field applying mechanism 1a of sputtering evaporation source is covered by the magnetic-field shielding units 21 and 22 and the deposition chamber inner wall 3a. However, in another embodiment, the magnetic-field applying mechanism 1a of sputtering evaporation source is covered by magnetic-field shielding unit(s) alone.

In the embodiment, the magnetic-field applying mechanisms 1 of sputtering evaporation sources and the magnetic-field applying mechanisms 2 of arc evaporation sources are arranged in the deposition chamber 3, but the configuration is not limited thereto. Typically, part of these magnetic-field applying mechanisms may be provided out of the deposition chamber 3.

The magnetic-field shielding units 21 and 22 in the embodiment include openable units 21b and 22b and fixed units 21c and 22c, but the configuration is not limited thereto. Typically, in another embodiment, a magnetic-field shielding unit includes one or more openable units alone so as to shield a magnetic field generated by a magnetic-field applying mechanism.

The above-mentioned embodiments are not intended to limit the scope of the present invention, various modifications and variations may be made without deviating from the scope and sprit of the present invention, and they all fall within the scope of the present invention.

Examples

The present invention will be illustrated in further detail with reference to a working example below. It should be noted, however, that the working example is not intended to limit the scope of the present invention, various modifications and variations may be made without deviating from the scope and sprit of the present invention, and they all fall within the scope of the present invention Comparative Example Magnetic field analyses were performed using magnetic-field applying mechanisms for evaporation sources alone without magnetic-field shielding units. To evaluate how much degree magnetic fields interfere with each other, the magnetic field strengths in the vicinities of the centers of respective magnetic-field applying mechanisms for evaporation sources were calculated. When a magnetic-field applying mechanism of sputtering evaporation source or a magnetic-field applying mechanism of arc evaporation source was used as a single magnetic-field applying mechanism for evaporation source, the magnetic field strengths were 7.65 gausses when the magnetic-field applying mechanism of sputtering evaporation source was used alone; and 1.99 gausses when the magnetic-field applying mechanism of arc evaporation source was used alone.

Figure 4:
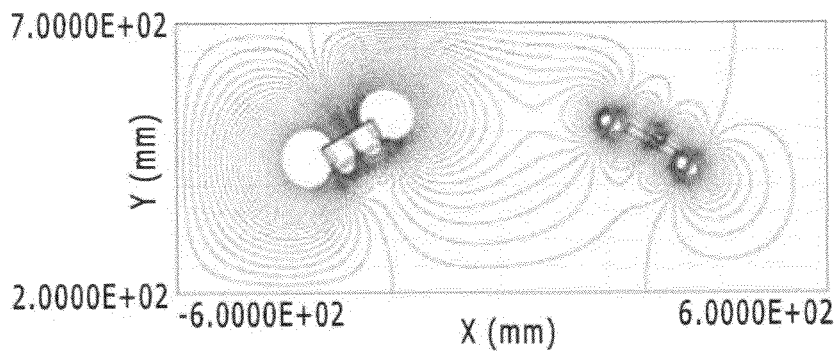
FIG. 4 is a view illustrating the result of a magnetic field analysis in a comparative example.

When the magnetic-field applying mechanism of sputtering evaporation source and magnetic-field applying mechanism of arc evaporation source were provided in the same deposition chamber (without magnetic-field shielding unit) so that their magnetic poles are connected to each other, the magnetic field strength was 9.54 gausses. The analysis result is indicated in FIG. 4. In FIG. 4 and after-mentioned FIGS. 5 to 8, the abscissa and the ordinate are indicated in units of millimeter (mm).

The results demonstrate that the magnetic field strength increases upon use of multiple magnetic-field applying mechanisms for evaporation sources as compared to the use of a single magnetic-field applying mechanism for evaporation source. The increase in magnetic field may become a problem particularly when deposition is performed by discharge of an arc evaporation source, and, in an arc process with a high ionization rate, this may probably affect the orbits of electrons and ionized target atoms.

Example

Magnetic field analyses were performed in vacuum deposition apparatuses having a magnetic-field applying mechanism of arc evaporation source; and a magnetic-field applying mechanism of sputtering evaporation source (balanced magnetron sputtering (BMS) or unbalanced magnetron sputtering (UBMS)) to examine magnetic-field shielding effects of magnetic-field shielding units.

Figure 5:
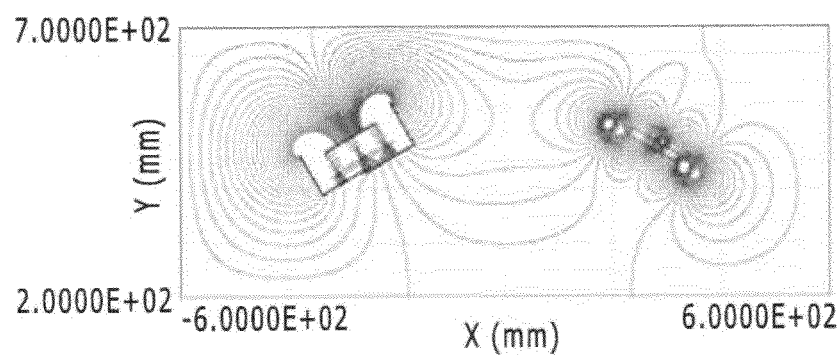
FIG. 5 is a view illustrating the result of a magnetic field analysis in a working example.

When the magnetic field generated by the magnetic-field applying mechanism of sputtering evaporation source was shielded by the action of a magnetic-field shielding unit made from a material having a high magnetic permeability, the magnetic field in the vicinity of the substrate was reduced by about one-half, i.e., 4.7 gausses. The analysis result is indicated in FIG. 5.

Figure 6:
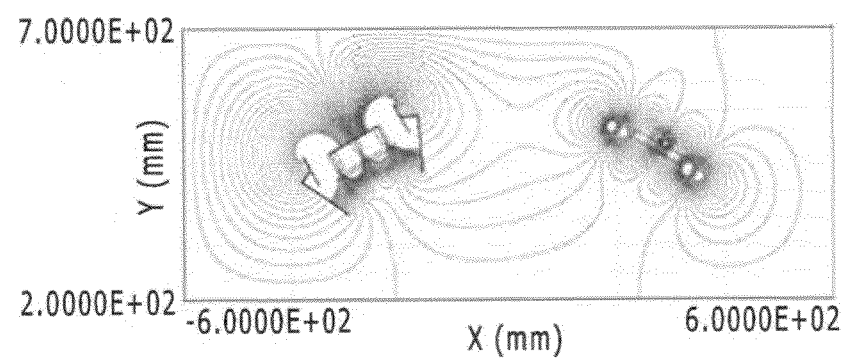
FIG. 6 is a view illustrating the result of a magnetic field analysis in the working example.
Figure 7:
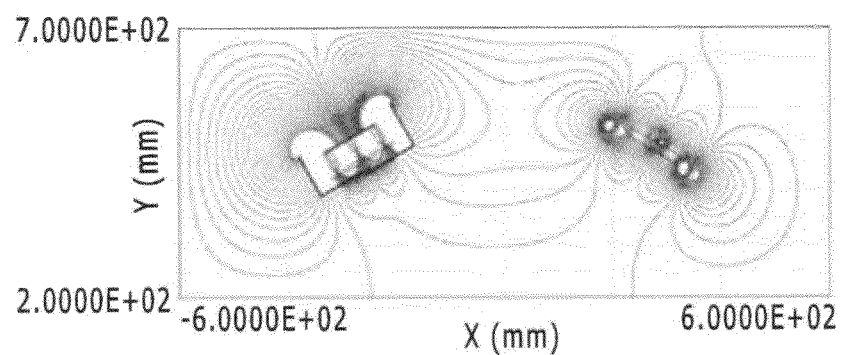
FIG. 7 is a view illustrating the result of a magnetic field analysis in the working example.
Figure 8:
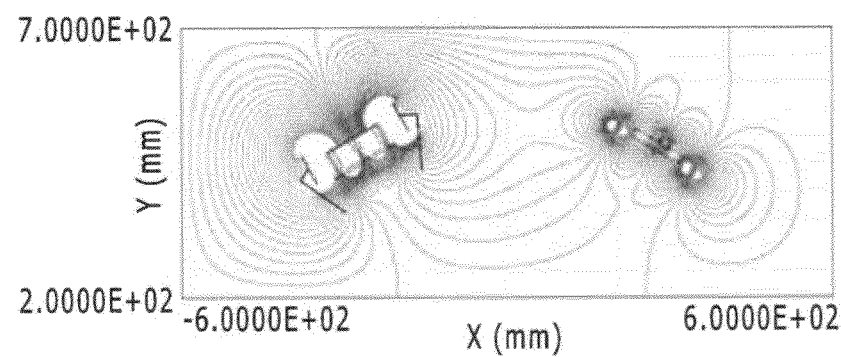
FIG. 8 is a view illustrating the result of a magnetic field analysis in the working example.

When deposition is performed by using an UBM magnetic-field applying mechanism of sputtering evaporation source, a strong magnetic field should also be applied to the vicinity of the substrate so as to increase the plasma density in the vicinity of the substrate. When the magnetic-field applying mechanism herein is used, the magnetic field intensity in the vicinity of the substrate with the magnetic-field shielding unit being opened was 6.0 gausses which is lower than that (7.65 gausses) generated by the single magnetic-field applying mechanism of sputtering evaporation source as mentioned above. The analysis result is indicated in FIG. 6.

Based on these findings, the present inventors designed a vacuum deposition apparatus for a higher magnetic field strength. Specifically, they found that, when part of the magnetic-field shielding unit is made from a non-magnetic material, the magnetic field is shielded with the magnetic-field shielding unit being closed, whereas the magnetic-field shielding effect is reduced with the magnetic-field shielding unit being opened. As a result, the magnetic field in the vicinity of the substrate had a lower strength of 4.7 gausses when the magnetic-field shielding unit was closed (see the analysis result in FIG. 7); whereas the magnetic field in the vicinity of the substrate had a higher strength of 8.0 gausses (as compared to the magnetic field strength mentioned above, i.e., 6.0 gausses) when the magnetic-field shielding unit was opened (see the analysis result in FIG. 8).

What is claimed is:

1. A vacuum deposition apparatus comprising:
   a deposition chamber;
   at least two magnetic-field applying mechanisms arranged in the deposition chamber, the at least two magnetic-field applying mechanisms being selected from the group consisting of a magnetic-field applying mechanism possessed by a sputtering evaporation source and a magnetic-field applying mechanism possessed by an arc evaporation source; and
   a magnetic-field shielding unit made from a magnetic material and arranged so as to cover partially or entirely at least one of the magnetic-field applying mechanisms,
   wherein the magnetic-field shielding unit can be movable between an open and a closed position, and
   wherein part of the magnetic-field shielding unit comprises a non-magnetic material arranged such that lines of magnetic force are able to pass through the magnetic-field shielding unit at the location of the non-magnetic material, and
   wherein the non-magnetic material is arranged such that the magnetic-field shielding unit shields the magnetic field when the magnetic-field shielding unit is at the closed position, and the shape and strength of the magnetic lines of force are greater when the magnetic-field shielding unit is at the open position.

2. The vacuum deposition apparatus according to claim 1, wherein the non-magnetic material is arranged at such a position of the magnetic-field shielding unit as to face an evaporation source when the magnetic-field shielding unit is closed.

3. The vacuum deposition apparatus according to claim 1, wherein the magnetic-field applying mechanism of the sputtering evaporation source is an unbalanced magnetron (UBM) mechanism,
   wherein the vacuum deposition apparatus has at least one magnetic-field applying mechanism of the sputtering evaporation source and at least one magnetic-field applying mechanism of the arc evaporation source, and wherein the magnetic-field shielding unit is arranged so as to face the at least one magnetic-field applying mechanism of the sputtering evaporation source.

4. The vacuum deposition apparatus according to claim 2, wherein the magnetic-field applying mechanism of the sputtering evaporation source is an unbalanced magnetron (UBM) mechanism, wherein the vacuum deposition apparatus has at least one magnetic-field applying mechanism of the sputtering evaporation source and at least one magnetic-field applying mechanism of the arc evaporation source, and wherein the magnetic-field shielding unit is arranged so as to face the at least one magnetic-field applying mechanism of the sputtering evaporation source.

* * * * *